US012615723B2

(12) United States Patent
Ishioka et al.

(10) Patent No.: US 12,615,723 B2
(45) Date of Patent: Apr. 28, 2026

(54) FRONT PAD AND HEAD-MOUNTED DISPLAY

(71) Applicant: Sony Interactive Entertainment Inc., Tokyo (JP)

(72) Inventors: Manabu Ishioka, Tokyo (JP); Haruka Iwamoto, Saitama (JP)

(73) Assignee: Sony Interactive Entertainment Inc., Tokyo (JP)

( * ) Notice: Subject to any disclaimer, the term of this patent is extended or adjusted under 35 U.S.C. 154(b) by 57 days.

(21) Appl. No.: 18/563,436

(22) PCT Filed: Jun. 1, 2022

(86) PCT No.: PCT/JP2022/022321
§ 371 (c)(1),
(2) Date: Nov. 22, 2023

(87) PCT Pub. No.: WO2022/259938
PCT Pub. Date: Dec. 15, 2022

(65) Prior Publication Data
US 2024/0224440 A1 Jul. 4, 2024

(30) Foreign Application Priority Data
Jun. 11, 2021 (JP) ................................. 2021-098105

(51) Int. Cl.
*H05K 5/00* (2006.01)
*A45F 5/00* (2006.01)
*H05K 5/02* (2006.01)
(52) U.S. Cl.
CPC ............. *H05K 5/0086* (2013.01); *A45F 5/00* (2013.01); *H05K 5/0217* (2013.01); *A45F 5/1525* (2025.01)

(58) Field of Classification Search
CPC ............ G02B 27/0176; G02B 27/0154; G02B 27/017; G02B 27/0276; G02B 27/0149; G02B 23/125; H04M 1/05; A45F 5/1525
(Continued)

(56) References Cited

U.S. PATENT DOCUMENTS

| | | | |
|---|---|---|---|
| 5,739,893 A | | 4/1998 | Karasawa et al. |
| 5,812,224 A | * | 9/1998 | Maeda ............... G02B 27/0176 |
| | | | 349/13 |

(Continued)

FOREIGN PATENT DOCUMENTS

| | | |
|---|---|---|
| CN | 206960780 U | 2/2018 |
| JP | 09130705 A | 5/1997 |

(Continued)

OTHER PUBLICATIONS

International Search Report for related PCT Application No. PCT/JP2022/022320, 4 pages, dated Jul. 26, 2022.

(Continued)

*Primary Examiner* — Adam J Waggenspack
(74) *Attorney, Agent, or Firm* — Kilpatrick Townsend & Stockton LLP

(57) ABSTRACT

A front pad that stabilizes a mounting state of a head-mounted display and a head-mounted display that includes the front pad are provided. The front pad includes an upper face and a contact inclined face that extends diagonally forwards and downwards from a rear end of the upper face and is to contact with the forehead of a user.

8 Claims, 11 Drawing Sheets

(58) Field of Classification Search
USPC ........................................................ 224/181
See application file for complete search history.

(56) References Cited

U.S. PATENT DOCUMENTS

| | | | |
|---|---|---|---|
| 8,479,738 B2 * | 7/2013 | Lang ................... | A61M 16/065 |
| | | | 128/205.25 |
| 10,989,919 B2 * | 4/2021 | Markovsky ........ | G02B 27/0176 |
| 2016/0370590 A1 * | 12/2016 | Fujishiro ............ | G02B 27/0176 |
| 2017/0205846 A1 | 7/2017 | Nagata | |
| 2019/0353901 A1 | 11/2019 | Markovsky | |

FOREIGN PATENT DOCUMENTS

| | | | |
|---|---|---|---|
| JP | 09281433 A | 10/1997 | |
| JP | 09292588 A1 | 11/1997 | |
| JP | 11119148 A | 4/1999 | |
| JP | 2016147071 A1 | 8/2016 | |
| JP | 2017011436 A | 1/2017 | |
| JP | 2017130931 A | 7/2017 | |
| JP | 2019068235 A | 4/2019 | |
| WO | 2020021951 A | 1/2020 | |

OTHER PUBLICATIONS

International Search Report for corresponding PCT Application No. PCT/JP2022/022321, 4 pages, dated Aug. 2, 2022.
EP22820120.8, "Extended European Search Report", Jul. 21, 2025, 7 pages.
JP2023-527647, "Office Action", Nov. 25, 2025, 8 pages.

* cited by examiner

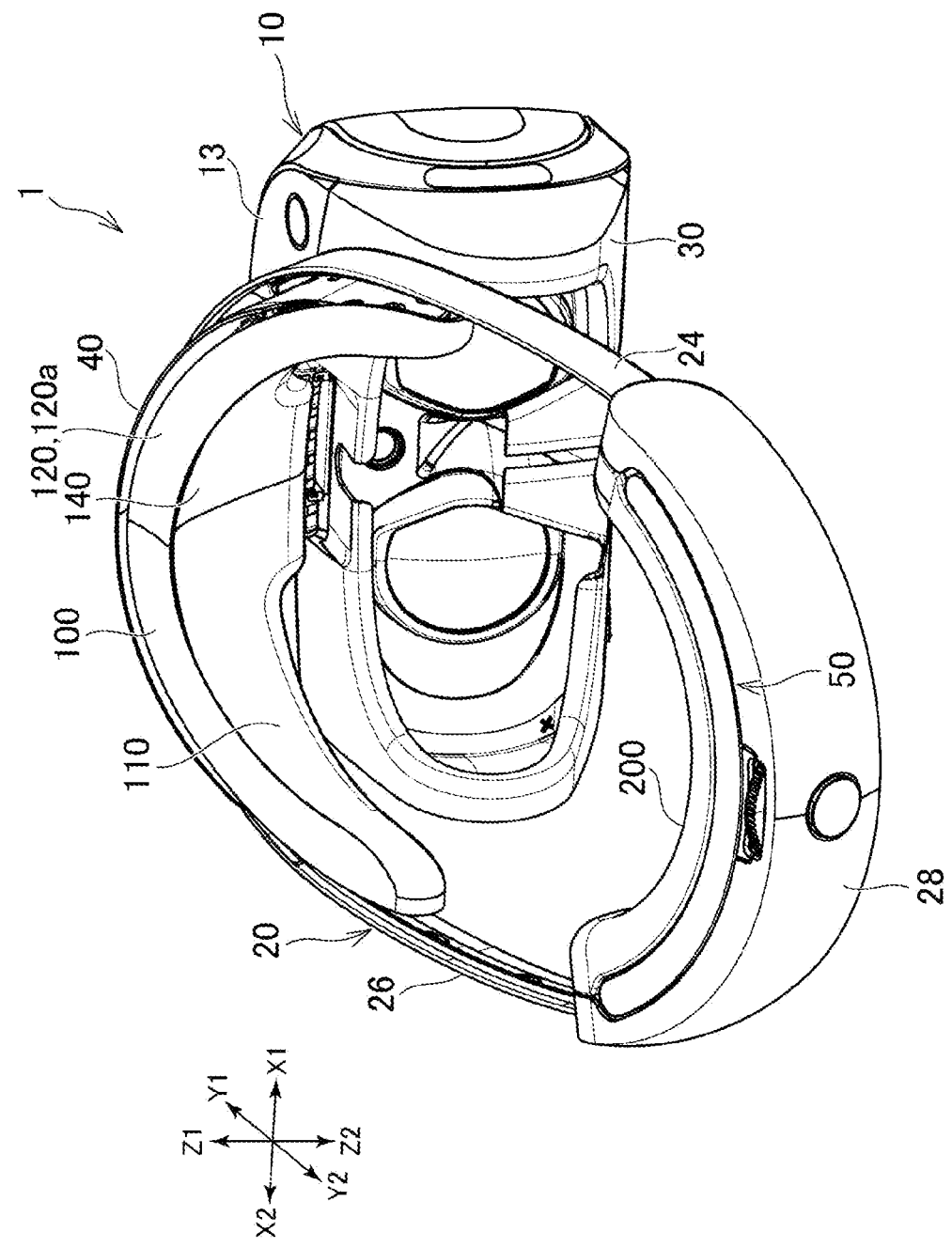
F I G . 1

F I G . 4
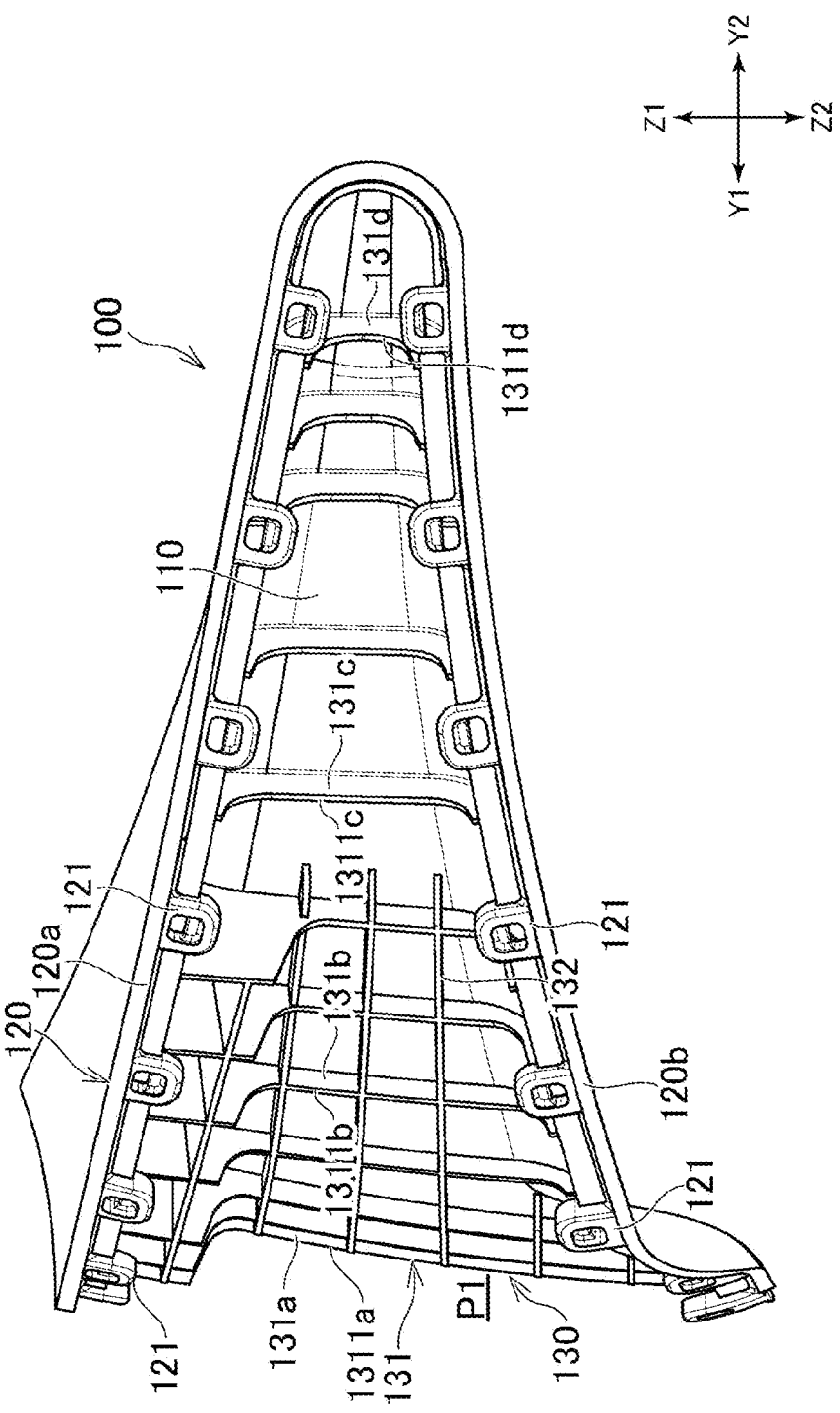

F I G . 5
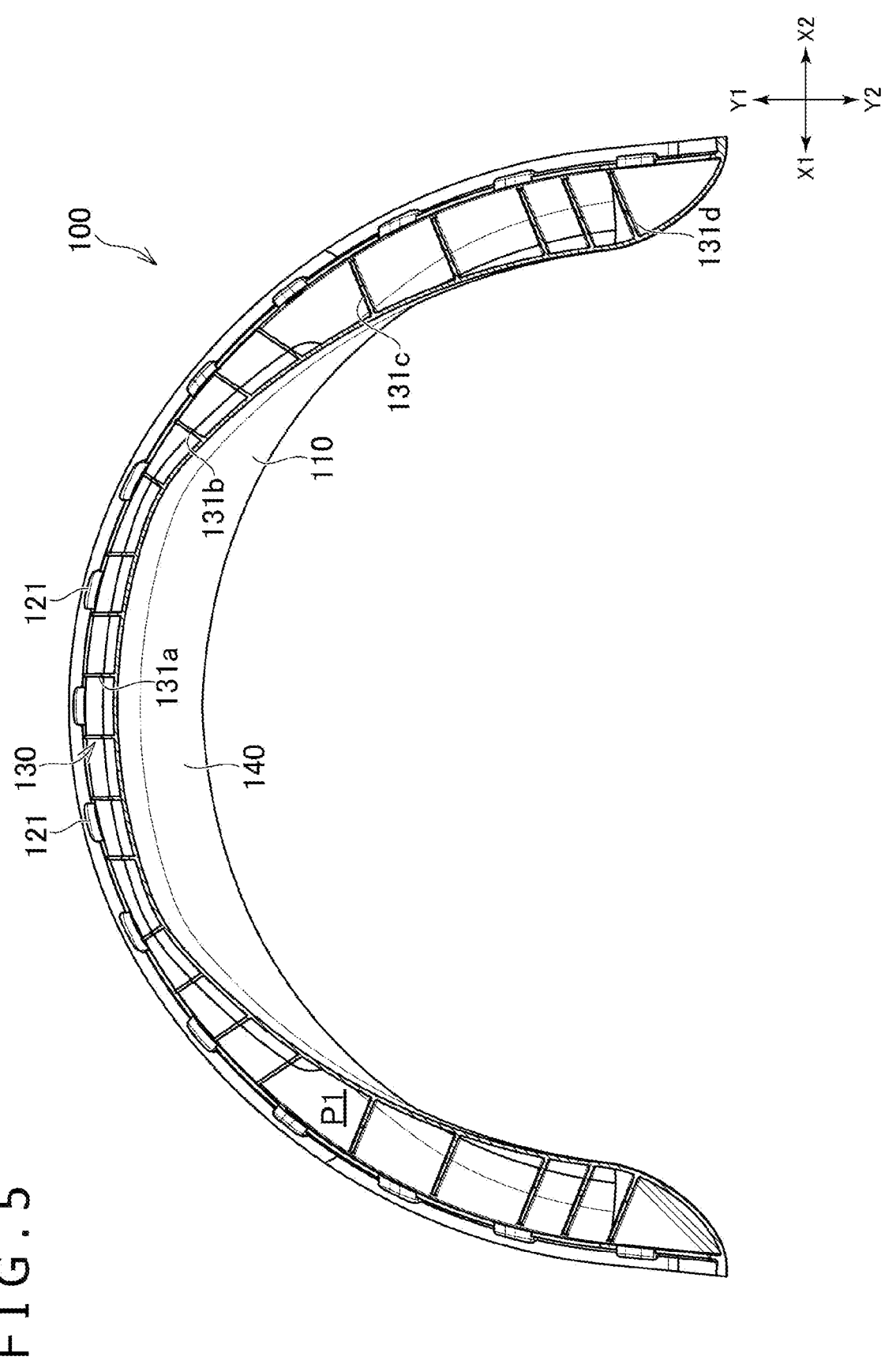

F I G . 8
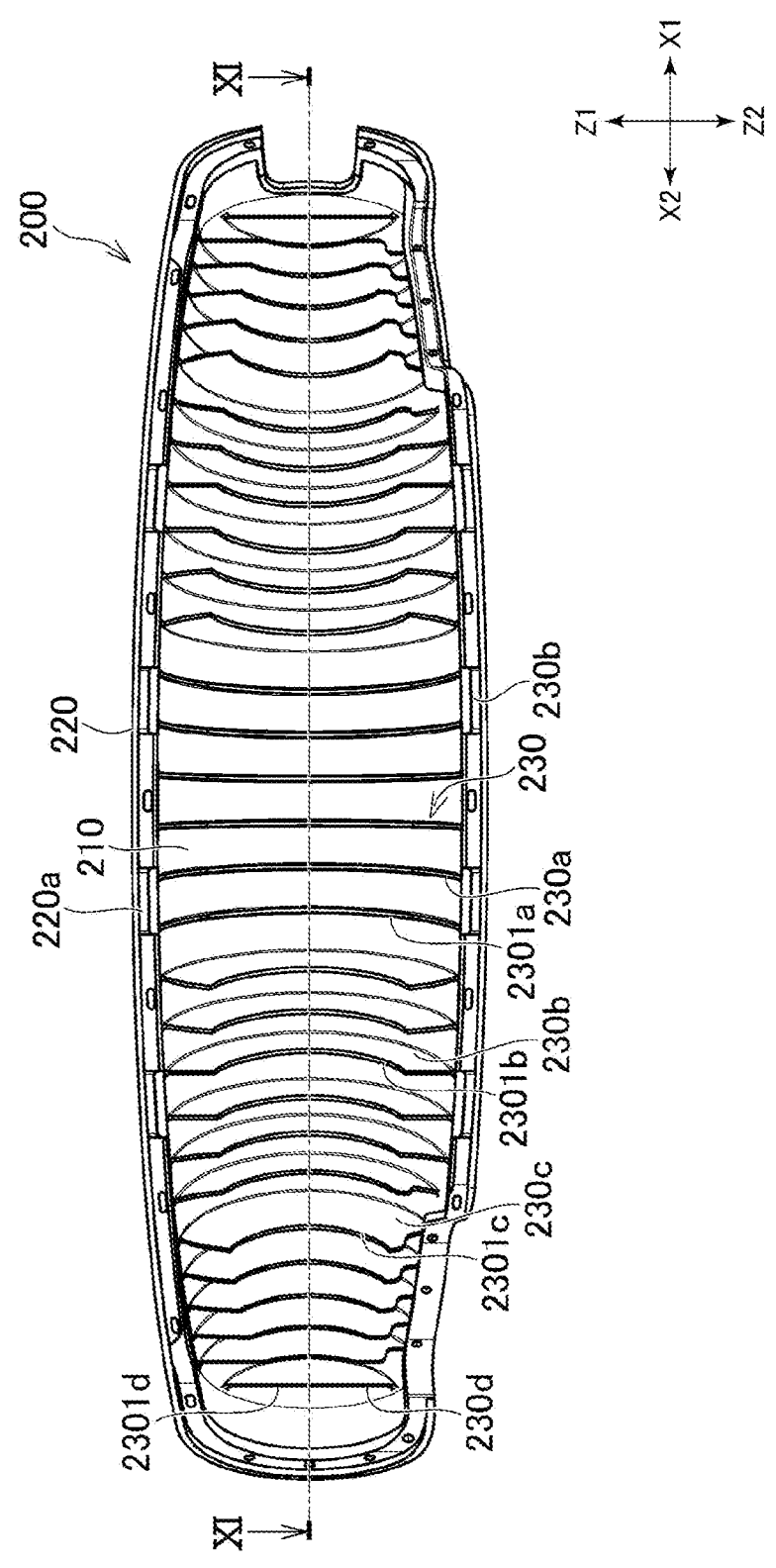

F I G . 1 1
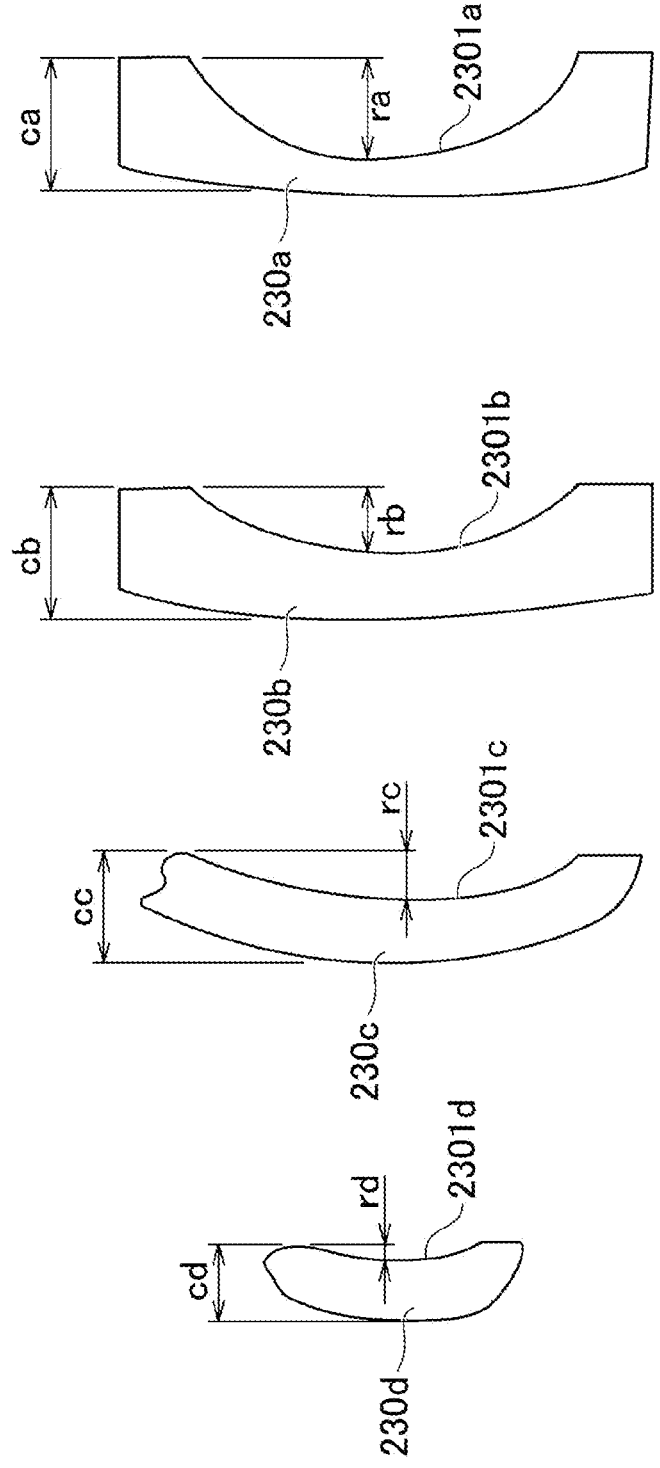

FRONT PAD AND HEAD-MOUNTED DISPLAY

TECHNICAL FIELD

The present disclosure relates to a front pad and a head-mounted display.

BACKGROUND ART

PTL 1 discloses a head-mounted display on which a pad including a cushion material provided in such a manner as to contact with the head of a user is provided.

CITATION LIST

Patent Literature

[PTL 1] Japanese Patent Laid-Open No. 2016-147071

SUMMARY

Technical Problem

Here, it is preferable that a head-mounted display be mounted on the head of a user stably without sliding down from the head of the user.

One of objects of the present disclosure resides in provision of a front pad that stabilizes the mounting state of a head-mounted display and a head-mounted display that includes the front pad.

Solution to Problem

An example of the front pad for a head-mounted display proposed in the present disclosure includes an upper face and a contact inclined face that extends diagonally forwards and downwards from a rear end of the upper face and is to contact with a forehead of a user.

An example of the head-mounted display proposed in the present disclosure includes the above-described front pad, a main body that accommodates a display therein, and a mounting band extending rearwardly from the main body. The front pad is attached to a front portion of the mounting band.

BRIEF DESCRIPTION OF DRAWINGS

FIG. 1 is a perspective view of a head-mounted display (HMD) according to the present embodiment as viewed from the right rear.

FIG. 4 is a view of the front pad of the present embodiment as viewed from the left.

FIG. 5 is a cross sectional view depicting a cross section taken along line V-V of FIG. 3.

FIG. 8 is a view of a rear pad of the present embodiment as viewed from the rear.

FIG. 11 is a view depicting a vertical rib of the rear pad of the present embodiment.

DESCRIPTION OF EMBODIMENT

In the following, an embodiment of the present invention (hereinafter referred to as a present embodiment) is described with reference to drawings. In the following description, a head-mounted display 1 is referred to as an "HMD 1."

In the following description, directions denoted by Y1 and Y2 in the figures are referred to as a forward direction and a rearward direction, respectively; directions denoted by Z1 and Z2 in the figures are referred to as an upward direction and a downward direction, respectively; and directions denoted by X1 and X2 in the figures are referred to as a rightward direction and a leftward direction, respectively. Such directions individually indicate directions as viewed from a user who is wearing the HMD 1. However, the upward and downward directions, the forward and rearward directions, and the leftward and rightward directions do not indicate strict directions. For example, the description "a mounting band 20 extends rearwardly from a main body 10" is not limited to the case of a mounting band 20 that extends in a direction orthogonal to the upward and downward direction and the forward and rearward direction but is intended to signify that the description includes the case of a mounting band 20 that extends in an inclined relation to a direction indicated by an arrow mark Y2.

[Overview of General Configuration of HMD 1]

Figure 2:
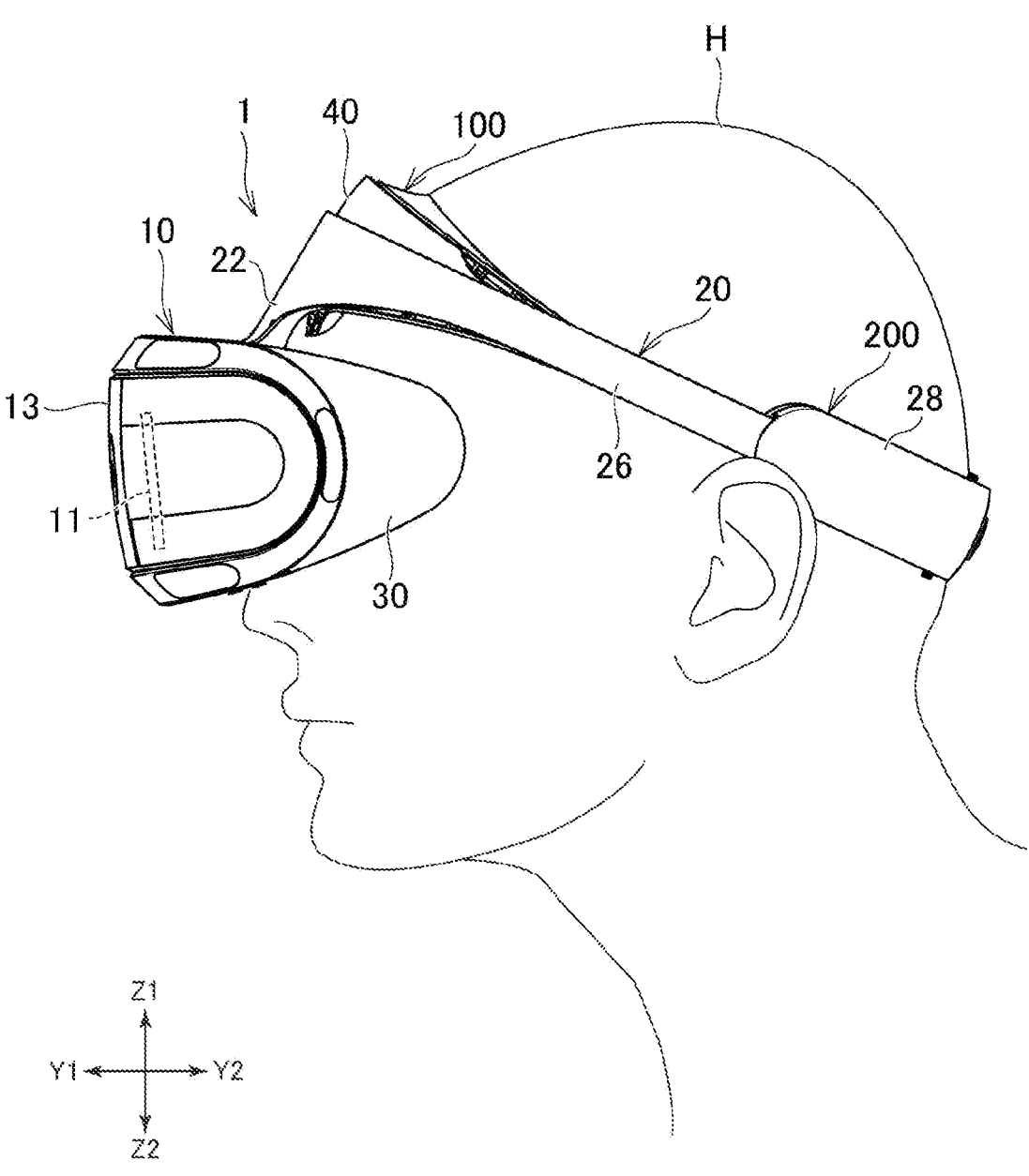
FIG. 2 is a left side elevational view depicting a use state of the HMD according to the present embodiment.

FIG. 1 is a perspective view of an HMD according to the present embodiment as viewed from the right rear. FIG. 2 is a left side elevational view depicting a use state of the HMD according to the present embodiment. It is to be noted that, in the following description, a state of the HMD 1 in which it is worn by a user is referred to as the "use state." As depicted in FIGS. 1 and 2, the HMD 1 includes a main body 10, a mounting band 20, a light shielding member 30, a front pad 100, and a rear pad 200.

The main body 10 includes a display 11, a lens 12, and a housing 13 in which the display 11 and the lens 12 are accommodated. In an example of the HMD 1, the display 11 displays a three-dimensional screen image. However, this is not restrictive, and the screen image that is displayed by the display 11 may otherwise be a two-dimensional screen image. Although it is preferred that the display 11 be, for example, a liquid crystal display or an organic electroluminescence display device, the type of the display 11 is not restricted specifically. As depicted in FIG. 2, in the use state of the HMD 1, the main body 10 covers the eyes of the user.

It is to be noted that, although the present embodiment is described in connection with an example in which the housing 13 has the display 11 built therein, this is not restrictive. For example, there may be adopted such a configuration that a portable terminal is accommodated in the main body 10 such that image light from a display of the portable terminal accommodated in the main body 10 is introduced to the eyes of the user. In this case, it is preferred to use, for example, a smartphone as the portable terminal. Further, the HMD 1 is not limited to a display of the non-transmission type and may be a head-mounted display of the transmission type.

The mounting band 20 extends rearwardly from the main body 10. In the use state of the HMD 1, the mounting band 20 surrounds a head H of the user. It is preferred that the mounting band 20 have an annular shape and the head H of the user be disposed in the inside of the annular mounting band 20. The mounting band 20 includes a supporting portion 22 that supports the main body 10 and that configures a front portion of the mounting band 20, a right extension portion 24 that extends rearwardly from the supporting portion 22 and that configures a right side portion of the mounting band 20, a left extension portion 26 that extends rearwardly from the supporting portion 22 and that configures a left side portion of the mounting band 20, and a rear portion case 28 that accommodates rear portions of the right extension portion 24 and the left extension portion 26 therein.

The mounting band 20 may have a function for adjusting the length thereof according to the size of the head H of the user. For example, it is preferred that the total length of the mounting band 20 be adjusted by adjusting the length of the right extension portion 24 and the left extension portion 26 that are accommodated in the rear portion case 28. However, it is sufficient if the mounting band 20 is mounted on the head H of the user and supports the main body 10, and the configuration depicted in FIGS. 1 and 2 is not restrictive. For example, the mounting band 20 may not have the supporting portion 22, and the right extension portion 24 and the left extension portion 26 may extend from the housing 13 of the main body 10. Further, although, in the example of the HMD 1, the mounting band 20 extends diagonally rearwards and downwards, the mounting band 20 may otherwise extend horizontally toward the rear.

The light shielding member 30 is attached to the housing 13 of the main body 10 and is a member that is provided to cut or reduce external light to be introduced into the eyes of the user who is wearing the HMD 1. It is preferred that the light shielding member 30 be configured from resin having elasticity.

[Front Pad 100]

Figure 3:
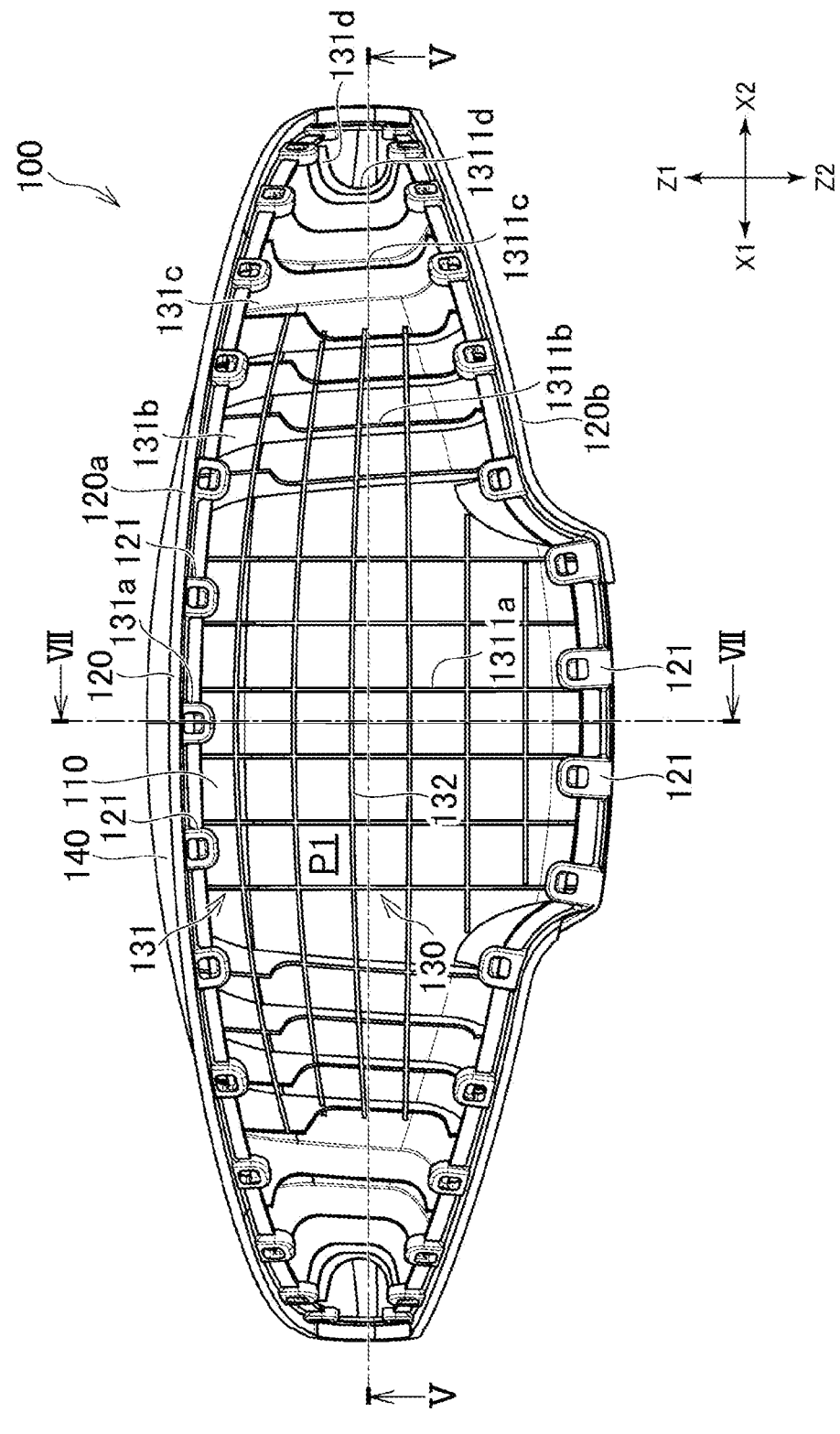
FIG. 3 is a view of a front pad of the present embodiment as viewed from the front.
Figure 6:
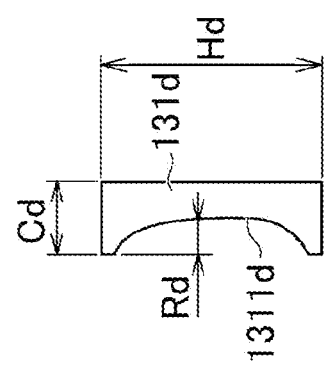
FIG. 6 is a view depicting vertical ribs of the front pad of the present embodiment.
Figure 6:
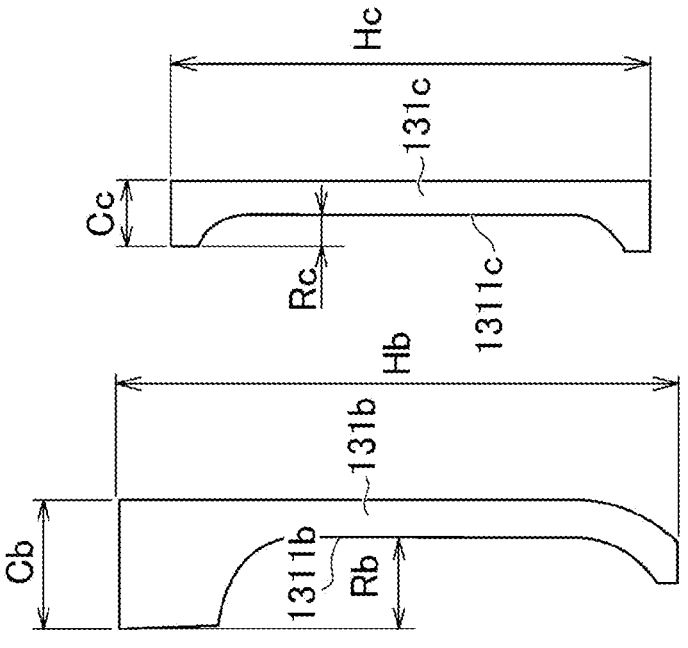
Figure 6:
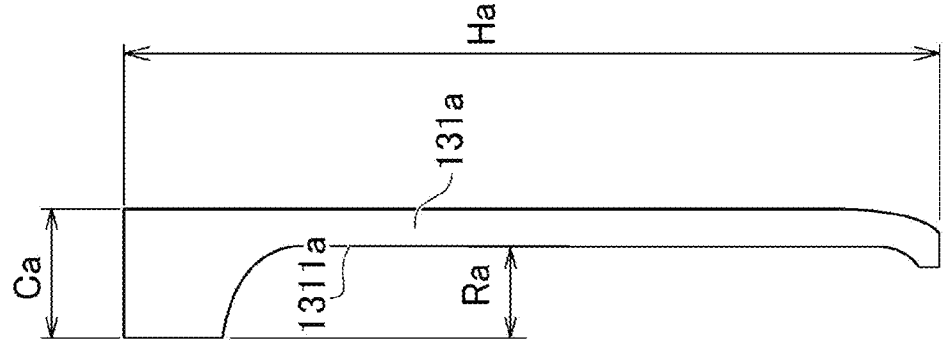
Figure 7:
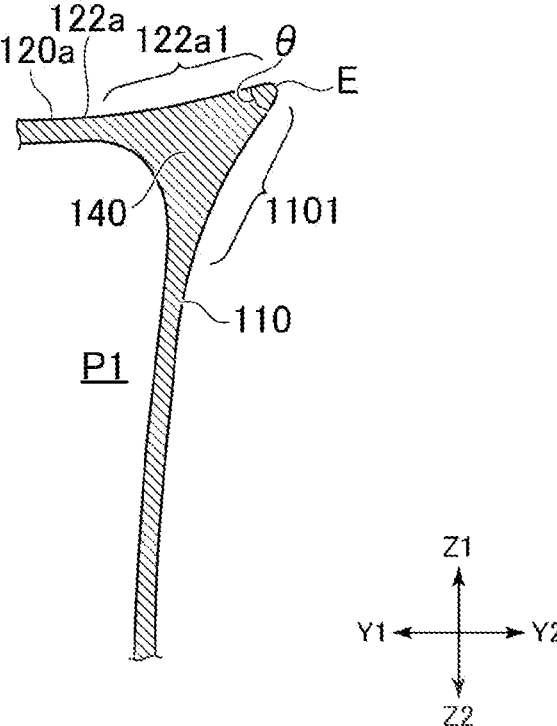
FIG. 7 is a cross sectional view depicting a cross section taken along line VII-VII of FIG. 3.

Details of the front pad 100 of the present embodiment are described with reference to FIGS. 1 to 7. FIG. 3 is a view of the front pad of the present embodiment as viewed from the front. FIG. 4 is a view of the front pad of the present embodiment as viewed from the left. FIG. 5 is a cross sectional view depicting a cross section taken along line V-V of FIG. 3. FIG. 6 is a view depicting vertical ribs of the front pad of the present embodiment. FIG. 7 is a cross sectional view depicting a cross section taken along line VII-VII of FIG. 3. It is to be noted that FIGS. 3 to 5 depict the front pad 100 removed from a pad supporting frame 40 hereinafter described.

The front pad 100 is a member that has elasticity and is to contact with the forehead (front portion of the head H) of the user in the use state of the HMD 1. Since the front pad 100 is provided, the tightness the user feels when the user wears the mounting band 20 can be relieved. This makes it possible to improve the wearability, and the user can use the HMD 1 comfortably.

It is preferred that the front pad 100 be attached to the pad supporting frame 40. Further, it is preferred that the pad supporting frame 40 be attached to the rear face (back face) of the supporting portion 22 of the mounting band 20. It is preferred that the pad supporting frame 40 be removably attached to the supporting portion 22 and be formed as a unit together with the front pad 100. However, this is not restrictive, and the pad supporting frame 40 may be fixed to the supporting portion 22. Further, the pad supporting frame 40 and the supporting portion 22 may be integral with each other. In other words, the pad supporting frame 40 may be part of the mounting band 20.

The front pad 100 includes an elastic surface portion 110, a protrusion edge portion 120, and an elastic rib 130. It is preferred that the elastic surface portion 110, the protrusion edge portion 120, and the elastic rib 130 be formed integrally and made of synthetic rubber such as silicone rubber, for example.

[Front Pad 100: Elastic Surface Portion 110]

The elastic surface portion 110 is a portion that contacts with the forehead of the user in the use state. It is preferred that the elastic surface portion 110 be curved in such a manner as to fit the forehead of the user. In particular, it is preferred that the elastic surface portion 110 be curved in such a manner to extend rearwardly from the center side toward the end portion sides in the leftward and rightward direction as depicted in FIGS. 1 and 5.

Further, it is preferred that the elastic surface portion 110 be shaped such that the width thereof in the upward and downward direction decreases toward the end portions in the leftward and rightward direction as depicted in FIG. 3. It is preferred that a central portion in the leftward and rightward direction of the elastic surface portion 110 have a width in the upward and downward direction which is greater than that at the right extension portion 24 and the left extension portion 26 while a right end portion and a left end portion of the elastic surface portion 110 have a width in the upward and downward direction which is equal to or smaller than the width of the right extension portion 24 and the left extension portion 26. By adopting such a shape as just described, it is possible to increase the area of a portion of the elastic surface portion 110 at which it contacts with the forehead of the user and suppress the right end portion and the left end portion of the elastic surface portion 110 from being visually recognized from the outside. This makes it possible to improve the wearability and suppress the designability from being impaired.

[Front Pad 100: Protrusion Edge Portion 120]

The protrusion edge portion 120 is a portion that protrudes forwardly from an edge of the elastic surface portion 110 as depicted in FIGS. 3 and 4. In the example depicted in FIGS. 3 and 4, an annular protrusion edge portion 120 which includes an upper edge portion 120*a* protruding from an upper portion of the elastic surface portion 110 and a lower edge portion 120*b* protruding from a lower portion of the elastic surface portion 110 is depicted.

It is preferred that the upper edge portion 120*a* and the lower edge portion 120*b* individually have a plurality of attachment portions 121 provided thereon. The attachment portions 121 are attached to the pad supporting frame 40 such that the front pad 100 is supported on the pad supporting frame 40. It is to be noted that, in FIGS. 3 and 4, only some of the plurality of attachment portions 121 are denoted by reference signs in order to prevent the figures from being complicated. The mounting structure of the front pad 100 on the pad supporting frame 40 is not restricted to the depicted example, and the front pad 100 may be mounted by being adhered with an adhesive or the like or may be fixed by welding or the like.

The protrusion edge portion 120 forms, with the elastic surface portion 110, a deformation permission space P1. The elastic surface portion 110 is elastically deformed and recessed forwardly when it is brought into contact with the forehead of the user. The deformation permission space P1 is a region that permits deformation of the elastic surface portion 110 therein caused through the contact of the elastic surface portion 110 with the forehead of the user. It is preferred that the deformation permission space P1 be formed between the pad supporting frame 40 and the elastic surface portion 110 and be a cavity in which any other member is disposed except a portion of the front pad 100.

[Front Pad 100: Elastic Rib 130]

If the thickness of the elastic surface portion 110 is small, then it is difficult for the elastic surface portion 110 to maintain its shape. Therefore, the present embodiment adopts a configuration that the elastic rib 130 that exerts reactive force against deformation of the elastic surface portion 110 is provided. The elastic rib 130 is formed on a face (front face) of the elastic surface portion 110 on the side opposite to a face of the elastic surface portion 110 with which the forehead of the user is to contact in the deformation permission space P1.

In the present embodiment, the elastic rib 130 includes a plurality of vertical ribs 131 that are first elastic ribs and a plurality of horizontal ribs 132 that are second elastic ribs.

[Front Pad 100: Vertical Ribs 131]

The plurality of vertical ribs 131 are shaped in such a manner as to protrude from the face (front face) of the elastic surface portion 110 on the side opposite to the side on which the elastic surface portion 110 contacts with the head of the user and extend from the upper edge portion 120a to the lower edge portion 120b of the protrusion edge portion 120. Further, the plurality of vertical ribs 131 are disposed in a spaced relation from each other by a predetermined distance in the leftward and rightward direction.

If the elastic surface portion 110 is brought into contact with the forehead of the user, then the elastic surface portion 110 is elastically deformed such that the surface area thereof is expanded. Upon such deformation, the plurality of vertical ribs 131 formed from the upper edge portion 120a to the lower edge portion 120b are stretched, resulting in generation of reactive force against the deformation of the elastic surface portion 110. Therefore, the shape of the elastic surface portion 110 is maintained. Further, by the reactive force against the deformation of the elastic surface portion 110, the elasticity of the front pad 100 is increased. As a result, the wearability of the HMD 1 is improved.

Here, the front pad 100 preferably has a portion that is easy to maintain its shape and another portion that is easy to be deformed, according to a portion that is to contact with the head H of the user. A peripheral edge portion of the elastic surface portion 110 is preferably easy to maintain the shape, and a central portion of the elastic surface portion 110 is preferably easy to be deformed in shape. In particular, an upper portion and a lower portion in the upward and downward direction of the elastic surface portion 110 are preferably easy to maintain the shape while the central portion in the upward and downward direction of the elastic surface portion 110 is preferably easy to be deformed. Further, a right portion and a left portion in the leftward and rightward direction of the elastic surface portion 110 are preferably easy to maintain the shape while a central portion in the leftward and rightward direction of the elastic surface portion 110 is preferably easy to be deformed. Such a configuration as just described improves the wearability and makes it easy to maintain the shape of the front pad 100 as a whole.

It is preferred that the length in the upward and downward direction of the plurality of vertical ribs 131 correspond to the width in the upward and downward direction of the elastic surface portion 110. In particular, it is preferred that vertical ribs 131 disposed on the center side in the leftward and rightward direction be longer than vertical ribs 131 disposed on the end portion sides in the leftward and rightward direction.

In FIG. 6, an appearance of a vertical rib 131a, a vertical rib 131b, a vertical rib 131c, and a vertical rib 131d depicted in FIGS. 3 to 5 when they are viewed from the left is depicted as an example. The vertical rib 131a is a vertical rib disposed at the central portion in the leftward and rightward direction. The vertical rib 131b is a vertical rib disposed on the left side with respect to the vertical rib 131a. The vertical rib 131c is a vertical rib disposed on the left side with respect to the vertical rib 131b. The vertical rib 131d is a vertical rib disposed on the left side with respect to the vertical rib 131c. In a case where the length in the upward and downward direction of the vertical rib 131a is represented by Ha, the length in the upward and downward direction of the vertical rib 131b is represented by Hb, the length in the upward and downward direction of the vertical rib 131c is represented by Hc, and the length in the upward and downward direction of the vertical rib 131d is represented by Hd, as depicted in FIG. 6, they have a relation of Ha>Hb>Hc>Hd.

The present embodiment adopts a configuration in which the reactive force against deformation of the elastic surface portion 110 is made different depending upon the portion of the elastic surface portion 110 by forming a recessed portion 1311 individually on the plurality of vertical ribs 131. The recessed portion 1311 is a portion that is recessed in a direction opposite to a protrusion direction of the vertical rib 131.

Each of the vertical ribs 131 has a recessed portion 1311 formed at a central portion thereof in the upward and downward direction. In particular, an upper portion and a lower portion of the vertical rib 131 in the upward and downward direction have a protrusion amount smaller than that at the central portion of the vertical rib 131. Owing to such a shape as just described, at the upper portion and the lower portion of the elastic surface portion 110, the shape is easily maintained, and the central portion of the elastic surface portion 110 is easily deformable in comparison with the upper portion and the lower portion.

Further, in the present embodiment, on a vertical rib 131 ((1-1)th elastic rib) on the center side in the leftward and rightward direction among the plurality of vertical ribs 131, a recessed portion having a comparatively great recession amount is formed such that the elastic surface portion 110 is easily deformable. Meanwhile, on a vertical rib 131 ((1-2)th elastic rib) on an end portion side in the leftward and rightward direction among the plurality of vertical ribs 131, a recessed portion having a comparatively small recession amount is formed such that the elastic surface portion 110 easily maintains the shape thereof. Here, it is assumed that the recession amount of the recessed portion 1311 is the length from the protrusion end face of the vertical rib 131 to the bottom face of the recessed portion 1311.

In the present embodiment, in a case where the recession amount of a recessed portion 1311a of the vertical rib 131a is represented by Ra, the recession amount of a recessed portion 1311b of the vertical rib 131b is represented by Rb, the recession amount of a recessed portion 1311c of the vertical rib 131c is represented by Rc, and a recession amount of the recessed portion 1311d of the vertical rib 131d is represented by Rd, as depicted in FIG. 6, they have a relation of Ra≥Rb>Rc≥Rd.

Further, it is preferred that the ratio of the recession amount to the protrusion amount of the vertical rib 131 ((1-1)th elastic rib) disposed on the center side in the leftward and rightward direction be equal to or higher than the ratio of the recession amount to the protrusion amount of the vertical rib 131 ((1-2)th elastic rib) disposed on the end portion side in the leftward and rightward direction. Note that it is assumed that the protrusion amount of the vertical rib 131 is a length from the rear face (front face) of the elastic surface portion 110 to the protrusion end face that protrudes most.

In the present embodiment, in a case where the protrusion amount of the recessed portion 1311*a* of the vertical rib 131*a* is represented by Ca, the protrusion amount of the vertical rib 131*b* is represented by Cb, the protrusion amount of the vertical rib 131*c* is represented by Cc, and the protrusion amount of the vertical rib 131*d* is represented by Cd, as depicted in FIG. 6, they have a relation of Ra/Ca≥Rb/Cb>Rc/Cc≥Rd/Cd.

It is to be noted that it is preferred that the protrusion end face of the vertical rib 131 do not contact with the pad supporting frame 40 at least in a state in which the elastic surface portion 110 is not deformed. By this, in the state in which the elastic surface portion 110 is not deformed, the vertical rib 131 maintains its posture without being deformed. Therefore, when the elastic surface portion 110 is deformed, higher reactive force can be generated.

Although a particular shape of the vertical ribs 131 has been described, the vertical ribs 131 depicted in FIG. 6 are an example and are not restrictive. For example, the vertical ribs 131 may not be formed from the upper edge portion 120*a* to the lower edge portion 120*b* of the protrusion edge portion 120 but may be formed as at least one of a vertical rib that is integral with the upper edge portion 120*a* and the elastic surface portion 110 and a vertical rib that is integral with the lower edge portion 120*b* and the elastic surface portion 110. In this case, the vertical ribs 131 may not have the recessed portion 1311 thereon. Further, the number of vertical ribs 131 is not restricted to that depicted in the figures, and it is sufficient if the number of vertical ribs 131 provided is one or more.

[Front Pad 100: Horizontal Rib 132]

The plurality of horizontal ribs 132 protrude from the face (front face) of the elastic surface portion 110 on the side opposite to the side on which the elastic surface portion 110 is to contact with the head H of the user. Further, the plurality of horizontal ribs 132 are formed in such a manner as to extend in the leftward and rightward direction and are disposed side by side in a spaced relation from each other by a predetermined distance in the upward and downward direction.

Further, it is preferred that the protrusion end face of the horizontal ribs 132 be common to the protrusion end face of the vertical ribs 131 as depicted in FIG. 4. When the horizontal ribs 132 are provided, the elastic surface portion 110 more easily maintains the shape thereof. It is preferred that the horizontal ribs 132 be formed integrally with the elastic surface portion 110 and the vertical ribs 131 and be made of synthetic rubber such as silicone rubber, for example.

It is to be noted that, in the present embodiment, the horizontal ribs 132 are not provided on a right portion and a left portion of the elastic surface portion 110. In the example depicted, the left end of the horizontal ribs 132 is positioned on the left side with respect to a vertical rib 131*c*. It is preferred that also the right end of the horizontal ribs 132 be positioned on the left side with respect to any one of the vertical ribs 131. By adopting a configuration that the length of the horizontal ribs 132 is not extended to the maximum with respect to the length in the leftward and rightward direction of the elastic surface portion 110 in the manner described above, the reactive force against deformation of the elastic surface portion 110 at the right portion and the left portion of the elastic surface portion 110 is suppressed from becoming excessively high. Further, if the forehead of the user is brought into contact with the central portion of the elastic surface portion 110 in the leftward and rightward direction, then the right portion and the left portion of the elastic surface portion 110 on which the horizontal ribs 132 are not provided are deformed to press the right side head portion and the left side head portion of the user. Therefore, even in a case where the user whose head is comparatively small uses, the wearability can be improved.

[Front Pad 100: Details of Shape of Upper Edge Portion 120*a* and Elastic Surface Portion 110]

Further, details of the shape of the upper edge portion 120*a* of the front pad 100 and the elastic surface portion 110 in the present embodiment are described. The front pad 100 includes a shape that protrudes rearwardly in such a manner as to extend along the forehead of the user.

In particular, as depicted in FIG. 7, the upper edge portion (an upper portion of the front pad 100) 120*a* includes an upper face 122*a* including an inclined face 122*a*1 extending diagonally forwards and downwards. Further, the elastic surface portion (a rear portion of the front pad 100) 110 includes a contact inclined face 1101 that extends diagonally forwards and downwards from a rear end E of the inclined face 122*a*1 and is to contact with the forehead of the user. It is preferred that the contact inclined face 1101 be shaped in such a manner as to be curved to extend along the shape of the forehead of the user.

It is preferred that an angle θ defined by the contact inclined face 1101 and the inclined face 122*a*1 of the upper face 122*a* be equal to or smaller than 45 degrees. However, this is not restrictive, and it is sufficient if the angle θ is an acute angle. It is to be noted that it is preferred that the angle θ be a minimum angle from among angles defined by the contact inclined face 1101 and the inclined face 122*a*1 of the upper face 122*a*.

Since the upper face 122*a* of the upper edge portion 120*a* is shaped in such a manner as to include the inclined face 122*a*1 extending diagonally forwards and downwards, the area of the portion of the elastic surface portion 110 that contacts with the forehead of the user can be increased. This improves the wearability.

Further, it is preferred that the contact inclined face 1101 and the inclined face 122*a*1 of the upper edge portion 120*a* form an increased thickness portion 140 having a thickness greater than that of a portion of the elastic surface portion 110 lower than the contact inclined face 1101. This improves the strength of a portion of the front pad 100 at which it supports the weight of the HMD 1. It is to be noted that, without changing the thickness itself, the elastic surface portion 110 may be shaped in such a manner as to be bent, to form the contact inclined face 1101.

It is to be noted that the contact inclined face 1101 may be provided only at a central portion in the leftward and rightward direction of the front pad 100 but not provided on left and right end portions of the front pad 100. In other words, the increased thickness portion 140 may be provided only at the central portion in the leftward and rightward direction of the front pad 100 but may not be provided at the left and right end portions of the front pad 100.

By adopting such a configuration as described above, the mounting state of the HMD 1 on the user can be stabilized. In particular, since the contact inclined face 1101 is caught by the forehead of the user, the mounting band 20 is suppressed from sliding down from the head H of the user.

[Front Pad 100: Summary]

As described above, in the front pad 100 of the present embodiment, the number of parts can be reduced in comparison with that of a conventional head pad that uses sponge. In particular, in the present embodiment, means for exerting elasticity in the front pad 100 can be configured from a single member. Further, since the step of fixing a plurality of parts with a bonding agent or a double-sided adhesive tape is unnecessary, the number of steps required for manufacture can be reduced. Further, by adopting a configuration having the elastic rib 130, it is possible to maintain the shape of the elastic surface portion 110 and improve the wearability. Further, by adopting the front pad 100 made of silicone rubber, it is less likely to suffer from time dependent deterioration in comparison with a conventional head pad that uses a urethane skin that wraps the sponge.

It is to be noted that the front pad 100 may not have the elastic rib 130. In this case, it is preferred that the elastic surface portion 110 have a thickness with which the elastic surface portion 110 can maintain its shape. Further, the front pad 100 may have the vertical ribs 131 but may not have the horizontal ribs 132.

[Rear Pad 200]

Figure 9:
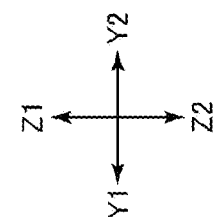
FIG. 9 is a view of the rear pad of the present embodiment as viewed from the left.
Figure 9:
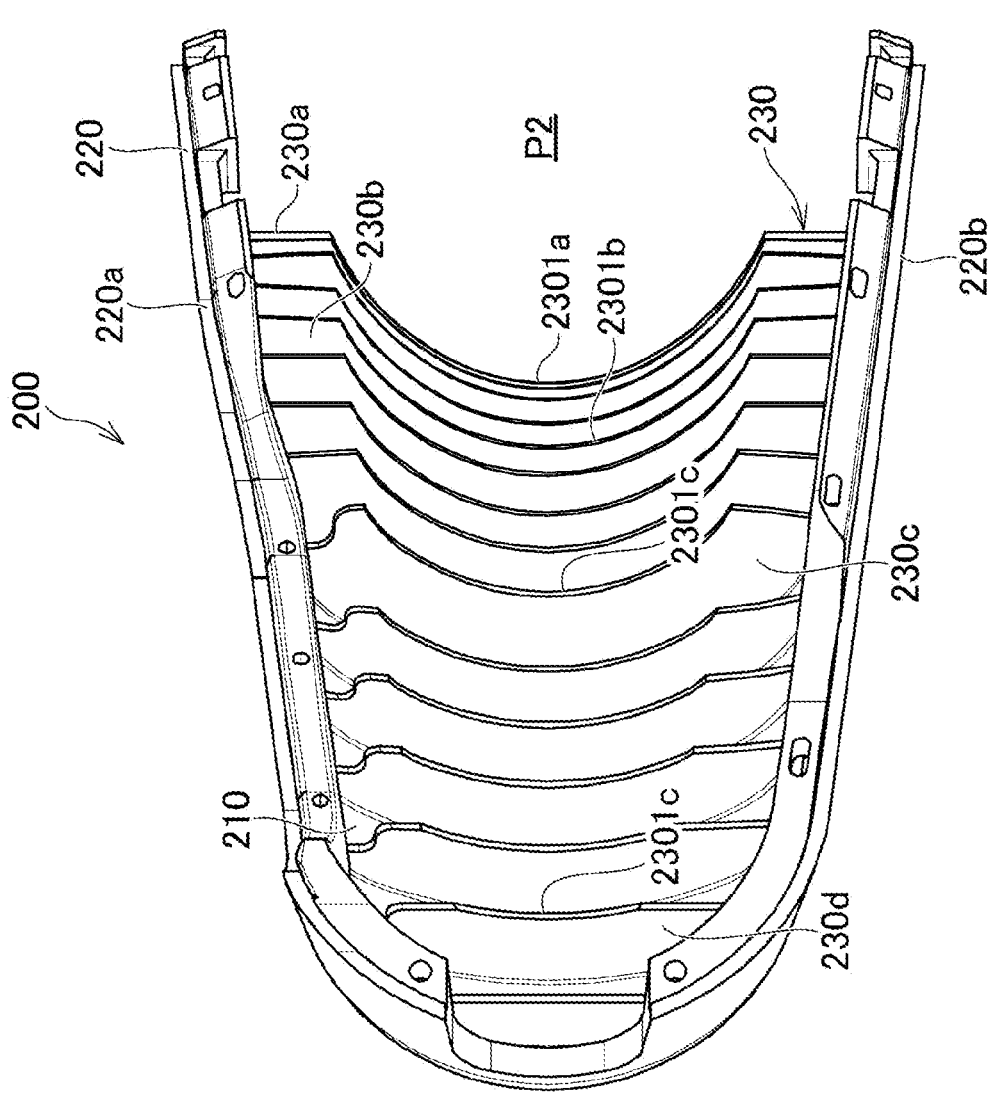
Figure 10:
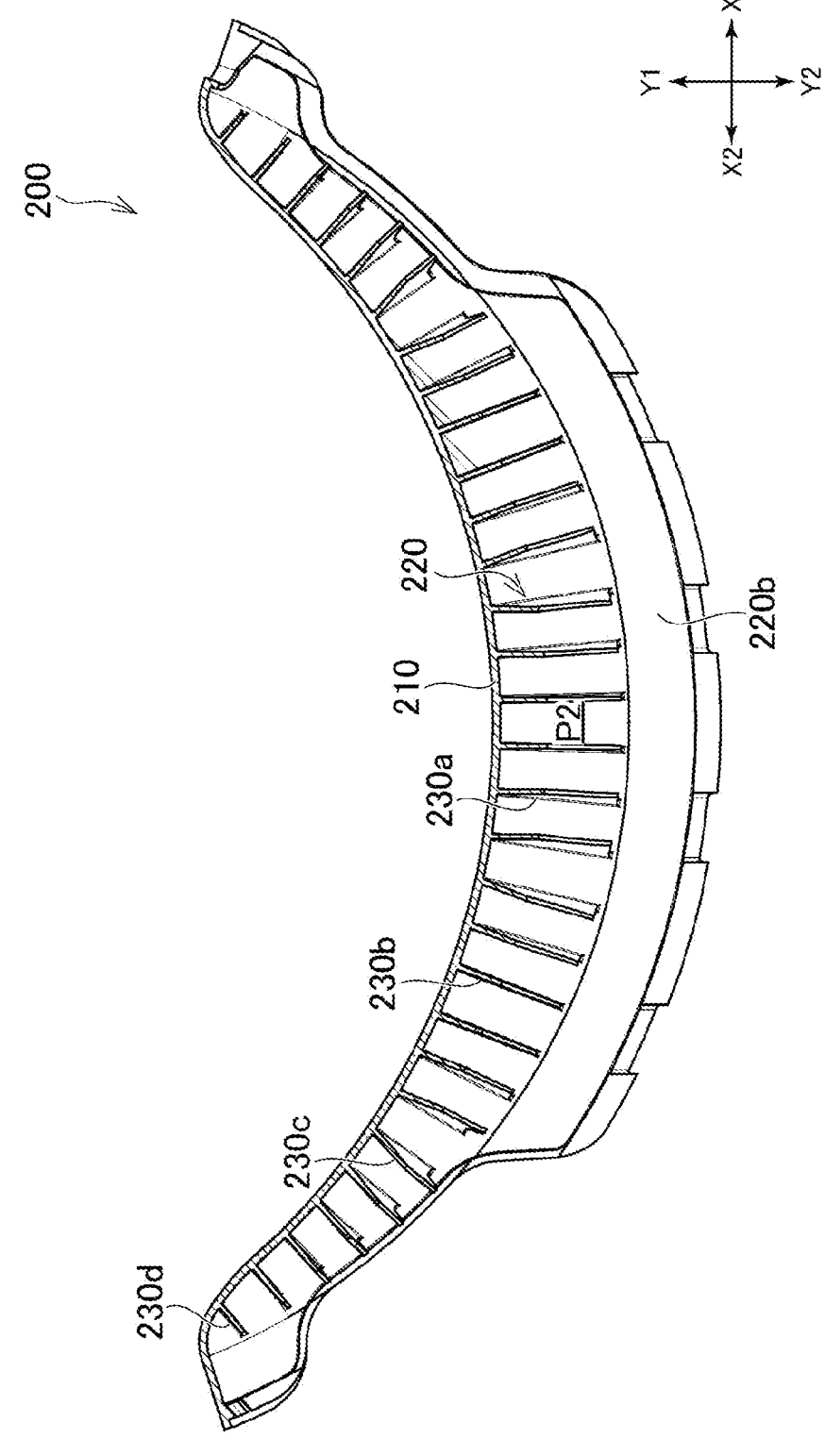
FIG. 10 is a cross sectional view depicting a cross section taken along line X1-X1 of FIG. 8.

Now, details of the rear pad 200 of the present embodiment are described with reference to FIGS. 1 and 8 to 11. FIG. 8 is a view of the rear pad of the present embodiment as viewed from the rear. FIG. 9 is a view of the rear pad of the present embodiment as viewed from the left. FIG. 10 is a cross sectional view depicting a cross section taken along XI-XI of FIG. 8. FIG. 11 is a view depicting a vertical rib of the rear pad of the present embodiment. It is to be noted that FIGS. 8 to 10 depict the rear pad 200 removed from a pad supporting frame 50 hereinafter described.

The rear pad 200 is a member that has elasticity and is to contact with the back of the head H of the user in the use state of the HMD 1. Since the rear pad 200 is provided, the tightness the user feels when the user is wearing the mounting band 20 can be relieved. Consequently, the wearability is improved, and the user can use the HMD 1 comfortably.

It is preferred that the rear pad 200 be attached to the pad supporting frame 50. Although a method of attaching the rear pad 200 to the pad supporting frame 50 is not restricted specifically, it is preferred that the rear pad 200 be adhered to the pad supporting frame 50 by, for example, a bonding agent or the like. Further, it is preferred that the pad supporting frame 50 be attached to the front face of the rear portion case 28 of the mounting band 20. It is preferred that the pad supporting frame 50 be removably attached to the rear portion case 28 and be formed as a unit together with the rear pad 200. However, this is not restrictive, and the pad supporting frame 50 may otherwise be fixed to the rear portion case 28. Further, the pad supporting frame 50 and the rear portion case 28 may be integrated with each other. In particular, the pad supporting frame 50 may be part of the mounting band 20. It is to be noted that the pad supporting frame 50 may be covered with the rear portion case 28 such that the pad supporting frame 50 cannot be visually recognized from the outside. In FIG. 1, a position at which the pad supporting frame 50 is attached is depicted.

The rear pad 200 includes an elastic surface portion 210, a protrusion edge portion 220, and an elastic rib 230. It is preferred that the elastic surface portion 210, the protrusion edge portion 220, and the elastic rib 230 be formed integrally with each other and be made of synthetic rubber such as silicone rubber, for example.

[Rear Pad 200: Elastic Surface Portion 210]

The elastic surface portion 210 is a portion that contacts with the back of the head of the user in the use state. It is preferred that the elastic surface portion 210 be curved in such a manner as to fit the back of the head of the user. In particular, it is preferred that the elastic surface portion 210 be curved in such a manner as to extend forwardly toward end portion sides from the center side thereof in the leftward and rightward direction as depicted in FIGS. 1 and 10.

[Rear Pad 200: Protrusion Edge Portion 220]

The protrusion edge portion 220 is a portion that protrudes rearwardly from an edge of the elastic surface portion 210 as depicted in FIG. 9. In the example depicted in FIG. 9, a substantially annular protrusion edge portion 220 which includes an upper edge 220*a* provided at an upper portion of the elastic surface portion 210 and the lower edge portion 120*b* provided at a lower portion of the elastic surface portion 210 is depicted.

The protrusion edge portion 220 forms, with the elastic surface portion 210, a deformation permission space P2. The elastic surface portion 210 is deformed elastically and recessed rearwardly when it is brought into contact with the back of the head of the user. The deformation permission space P2 is a region that permits deformation of the elastic surface portion 210 therein caused through contact of the elastic surface portion 210 with the back of the head of the user. It is preferred that the deformation permission space P2 be formed between the pad supporting frame 50 and the elastic surface portion 210 and be a cavity in which any other member is disposed except the portion of the rear pad 200.

[Rear Pad 200: Vertical Rib 230]

If the elastic surface portion 210 has a small thickness, then it is difficult for the elastic surface portion 210 to maintain its shape. Therefore, the present embodiment adopts a configuration that includes a vertical rib 230 that is a first elastic rib that exerts reactive force against deformation of the elastic surface portion 210. The vertical rib 230 is formed on a face (rear face) of the elastic surface portion 210 on the side opposite to a face with which the forehead of the user is to contact in the deformation permission space P2.

A plurality of vertical ribs 230 are shaped in such a manner as to protrude from the face (rear face) of the elastic surface portion 210 on the side opposite to the side on which the elastic surface portion 210 is to contact with the back of the head of the user and extend from the upper edge 220*a* to a lower edge 220*b* of the protrusion edge portion 220. Further, the plurality of vertical ribs 230 are disposed side by side in a spaced relation from each other by a predetermined distance in the leftward and rightward direction.

If the back of the head of the user contacts with the elastic surface portion 210, then the elastic surface portion 210 is elastically deformed such that its surface area is expanded. At this time, the plurality of vertical ribs 230 formed from the upper edge 220*a* to the lower edge 220*b* are stretched, resulting in generation of reactive force against the deformation of the elastic surface portion 210. Therefore, the shape of the elastic surface portion 210 is maintained. Further, by the reactive force against the deformation of the elastic surface portion 210, the elasticity of the rear pad 200 is improved. As a result, the wearability of the HMD 1 is improved.

Here, the rear pad 200 preferably has a portion that is easy to maintain its shape and a portion that is easy to be deformed, according to a portion that is to contact with the back of the head of the user. A peripheral edge portion of the elastic surface portion 210 is preferably easy to maintain the shape, and a central portion of the elastic surface portion 210 is preferably easy to be deformed in shape. In particular, an upper portion and a lower portion in the upward and downward direction of the elastic surface portion 210 are preferably easy to maintain the shape while a central portion in the upward and downward direction of the elastic surface portion 210 is preferably easy to be deformed. Further, a right portion and a left portion in the leftward and rightward direction of the elastic surface portion 210 are preferably easy to maintain the shape while a central portion in the leftward and rightward direction of the elastic surface portion 210 is preferably easy to be deformed. Such a configuration as just described improves the wearability and makes it easy to maintain the shape of the rear pad 200 as a whole.

The present embodiment adopts a configuration that makes reactive force against deformation of the elastic surface portion 210 different depending upon the portion of the elastic surface portion 210 by forming a recessed portion 2301 in each of the plurality of vertical ribs 230. The recessed portion 2301 is a portion that is recessed in a direction opposite to a protrusion direction of the vertical ribs 230.

Each of the vertical ribs 230 has a recessed portion 2301 formed at the central portion thereof in the upward and downward direction. Since the vertical rib 230 has such a shape as just described, at an upper portion and a lower portion of the elastic surface portion 210, the vertical rib 230 becomes easy to maintain the shape while, at the central portion of the elastic surface portion 210, the vertical rib 230 is easily deformed in comparison with the upper portion and the lower portion.

Further, in the present embodiment, on a vertical rib 230 ((1-1)th elastic rib) on the center side in the leftward and rightward direction among the plurality of vertical ribs 230, a recessed portion 2301 having a comparatively great recession amount is formed such that the elastic surface portion 210 can be deformed easily. On the other hand, on a vertical rib 230 ((1-2)th elastic rib) on an end portion side in the leftward and rightward direction among the plurality of vertical ribs 230, a recessed portion 2301 having a comparatively small recession amount is formed such that the elastic surface portion 210 can maintain its shape easily. Here, it is assumed that the recession amount of the recessed portion 2301 is a length from the protrusion end face of the vertical rib 230 to the bottom face of the recessed portion 2301.

In a case where the recession amount of the recessed portion 2301*a* of the vertical rib 230*a* is represented by ra, the recession amount of the recessed portion 2301*b* of the vertical rib 230*b* is represented by rb, the recession amount of the recessed portion 2301*c* of the vertical rib 230*c* is represented by Rc, and the recession amount of the recessed portion 2301*d* of the vertical rib 230*d* is represented by rd, as depicted in FIG. 11, they have a relation of ra≥rb>rc≥rd.

Further, it is preferred that the ratio of the recession amount to the protrusion amount of a vertical rib 230 disposed on the center side in the leftward and rightward direction be equal to or higher than the ratio of the recession amount to the protrusion amount of a vertical rib 230 disposed on an end portion side in the leftward and rightward direction. Note that it is assumed that the protrusion amount of the vertical rib 230 is the length from the rear face of the elastic surface portion 210 to the protrusion end face that protrudes most.

In the present embodiment, in a case where the protrusion amount of the recessed portion 2301*a* of the vertical rib 230*a* is represented by ca, the protrusion amount of the vertical rib 230*b* is represented by cb, the protrusion amount of the vertical rib 230*c* is represented by cc, and the protrusion amount of the vertical rib 230*d* is represented by cd, as depicted in FIG. 11, they have a relation of ra/ca≥rb/cb>rc/cc≥rd/cd.

It is to be noted that it is preferred that the protrusion end face of the plurality of vertical ribs 230 do not contact with the pad supporting frame 50 at least in a state in which the elastic surface portion 210 is not deformed. By this, in the state in which the elastic surface portion 210 is not deformed, the vertical rib 230 maintains its posture without being deformed. Therefore, when the elastic surface portion 210 is deformed, higher reactive force can be generated.

Although the particular shape of the vertical ribs 230 has been described, the vertical ribs 230 depicted in the figures are an example and are not restrictive. For example, each of the vertical ribs 230 may not be formed from the upper edge 220*a* to the lower edge 220*b* of the protrusion edge portion 220 but may have formed thereon at least one of a vertical rib that is integrated with the upper edge 220*a* and the elastic surface portion 210 and another vertical rib that is integrated with the lower edge 220*b* and the elastic surface portion 210. In this case, the vertical rib 230 may not have the recessed portion 2301 thereon. Further, the number of vertical ribs 230 is not limited to that depicted in the figures, and it is sufficient if the number of vertical ribs 230 provided is one or more.

It is to be noted that the rear pad 200 may not have the vertical ribs 230. In this case, it is preferred that the elastic surface portion 210 have a thickness sufficient to maintain the shape thereof. Moreover, the rear pad 200 may further have horizontal ribs in addition to the vertical rib 230, similarly to the front pad 100.

The invention claimed is:

1. A device comprising:
a head mounting band; and
a front pad having a hollow portion and attached to the head mounting band, the front pad comprising:
an upper panel extending in a forward direction, the upper panel comprising:
an inclined face extending diagonally forwards and downwards from a rear end of the front pad, and
a forwardly extending portion extending from the inclined face; and
an rear panel extending from the upper panel and forming the hollow portion therebetween, the rear panel comprising:
a contact inclined face that extends diagonally forwards and downwards from the rear end of the front pad and is to contact with a forehead of a user, and
a downwardly extending portion extending from the contact inclined face,
wherein the forwardly extending portion of the upper panel and the downwardly extending portion of the rear panel comprise an empty space therebetween.

2. The device according to claim 1, wherein an angle defined by the contact inclined face and the upper panel is an acute angle.

3. The device according to claim 1, wherein the contact inclined face includes a shape curved in such a manner as to extend along the forehead of the user.

4. The device according to claim 1, wherein the contact inclined face and the upper panel form an increased thickness portion having a thickness greater than that of a portion lower than the contact inclined face.

5. The device according to claim 1, wherein an upper portion including the upper panel and rear panel including the contact inclined face are formed from a single member and are formed integrally with each other.

6. The device according to claim 5, wherein the single member is made of synthetic rubber.

7. The device according to claim 6, wherein the hollow portion between the upper portion and the rear panel define a deformation permission space that permits deformation of the rear panel caused through contact of the rear panel with the forehead of the user.

8. A head-mounted display comprising:
a front pad having a hollow portion, the front pad com-
prising:
an upper panel extending in a forward direction, the
upper panel comprising:
an inclined face extending diagonally forwards and
downwards from a rear end of the front pad; and a forwardly extending portion extending from the
inclined face; and
an rear panel extending from the upper panel and
forming the hollow portion therebetween, the rear
panel comprising:
a contact inclined face that extends diagonally for-
wards and downwards from the rear end of the
front pad and is to contact with a forehead of a
user; and
a downwardly extending portion extending from the
contact inclined face,
wherein the forwardly extending portion of the upper
panel and the downwardly extending portion of the
rear panel comprise an empty space therebetween;
a main body that accommodates a display therein; and
a mounting band extending rearwardly from the main
body,
wherein the front pad is attached to a front portion of the
mounting band.

\* \* \* \* \*